(12) United States Patent
Du et al.

(10) Patent No.: US 11,437,414 B2
(45) Date of Patent: Sep. 6, 2022

(54) DISPLAY PANEL AND DISPLAY DEVICE

(71) Applicant: TCL CHINA STAR OPTOELECTRONICS TECHNOLOGY CO., LTD., Shenzhen (CN)

(72) Inventors: Peng Du, Shenzhen (CN); Qiaoqiao Song, Shenzhen (CN)

(*) Notice: Subject to any disclaimer, the term of this patent is extended or adjusted under 35 U.S.C. 154(b) by 307 days.

(21) Appl. No.: 16/626,359

(22) PCT Filed: Dec. 19, 2019

(86) PCT No.: PCT/CN2019/126628
§ 371 (c)(1),
(2) Date: Dec. 24, 2019

(87) PCT Pub. No.: WO2021/056867
PCT Pub. Date: Apr. 1, 2021

(65) Prior Publication Data
US 2021/0408084 A1  Dec. 30, 2021

(30) Foreign Application Priority Data
Sep. 27, 2019 (CN) .......................... 201910922443.9

(51) Int. Cl.
*H01L 27/12* (2006.01)
*G02F 1/1345* (2006.01)
*G02F 1/1368* (2006.01)

(52) U.S. Cl.
CPC ........ *H01L 27/1255* (2013.01); *G02F 1/1368* (2013.01); *G02F 1/13454* (2013.01); *H01L 27/124* (2013.01)

(58) Field of Classification Search
CPC ............. H01L 27/1255; H01L 27/3265; G02F 1/136213
See application file for complete search history.

(56) References Cited

U.S. PATENT DOCUMENTS

2012/0218485 A1    8/2012  Chikama et al.
2020/0320946 A1*  10/2020  Shi ....................... G09G 3/3208

FOREIGN PATENT DOCUMENTS

| CN | 103018991 | A |   | 4/2013 |            |
|----|-----------|---|---|--------|------------|
| CN | 104536223 | A |   | 4/2015 |            |
| CN | 204314578 | U |   | 5/2015 |            |
| CN | 107527599 | A |   | 12/2017|            |
| CN | 108020971 | A |   | 5/2018 |            |
| CN | 108873514 | A | * | 11/2018|            |
| CN | 108873514 | A |   | 11/2018|            |
| CN | 208861649 | U |   | 5/2019 |            |
| KR | 20080022245 | A | * | 3/2008 | ........ G02F 1/136213 |

* cited by examiner

*Primary Examiner* — Peter M Albrecht

(57) ABSTRACT

The present invention provides a display panel and a display device. A conductive film layer of the display panel is electrically connected to a gate electrode of a thin film transistor (TFT) through a first via hole, and the conductive film layer at least partially overlaps a source/drain electrode of the TFT to form a first capacitor. A second capacitor is formed in an overlapping region between a source/drain electrode of the TFT and the gate electrode of the TFT. Accordingly, a boost capacitance value of the display panel is increased, and a driving circuit requires less space.

2 Claims, 3 Drawing Sheets

DISPLAY PANEL AND DISPLAY DEVICE

This application claims priority to Chinese Patent Application No. 201910922443.9, entitled "Display Panel and Display Device", filed on Sep. 27, 2019, the entire contents of which are incorporated by reference in this application.

1. FIELD OF DISCLOSURE

The present invention relates to a field of display technology and in particular, to a display panel and a display device.

2. DESCRIPTION OF RELATED ART

With development of low-cost and high-quality liquid crystal displays, gate driver on array (GOA) technology has been widely used for its low cost and high integration.

A display panel includes a plurality of GOA driving circuits. In a typical GOA circuit, a second thin film transistor (TFT) T21 in a second column of a clock signal (CK) line is connected to the clock signal line and a gate line of a pixel. In operation, a capacitor (i.e., a boost capacitor) is added between a gate electrode and a source electrode of the TFT T21. When the GOA circuit is outputting, the boost capacitor increases a potential of the gate electrode of the TFT T21 due to coupling, thereby increasing output capability of the circuit. However, the boost capacitor typically has a relatively large capacitance value. In a circuit layout, the boost capacitor takes up a lot of space, so it is difficult to decrease a width of a GOA region, which is very disadvantageous for the design of narrow-bezel products, and is not conducive to saving costs.

Therefore, it is necessary to provide a solution to solve the problems in conventional techniques.

In summary, in conventional gate driver on array (GOA) circuits, a boost capacitor occupies a large space, and it is difficult to reduce a width of a GOA region. This is disadvantageous for the design of narrow-bezel products, and production costs are high.

SUMMARY

The present invention provides a display panel and a display device to solve the problems in conventional GOA circuits that a width of the GOA region is relatively wide and difficult to reduce, a space occupied by a boost capacitor is large, and production costs are high.

Accordingly, the present provides solutions as follows.

According to a first aspect of the present invention, a display panel is provided, comprising:
a substrate;
a thin-film transistors (TFT) device layer disposed on the substrate;
a passivation layer disposed on the TFT device layer; and
a conductive film layer disposed on the passivation layer;
wherein the conductive film layer is electrically connected to a gate electrode of a TFT in the TFT device layer through a first via hole, and the conductive film layer at least partially overlaps a source/drain electrode of the TFT to form a first capacitor; and
wherein the first via hole is defined at one side of the source electrode of the TFT and extended through the TFT device layer and the passivation layer, and the conductive film layer comprises a pixel electrode film layer.

According to one embodiment of the present invention, the conductive film layer entirely covers the passivation layer.

According to one embodiment of the present invention, the conductive film layer is disposed on the passivation layer and covers a portion of the source electrode of the TFT.

According to one embodiment of the present invention, the display panel further comprises a second capacitor, and the second capacitor is formed in an overlapping region of the source/drain electrode of the TFT and the gate electrode of the TFT.

According to one embodiment of the present invention, the first capacitor is connected in parallel with the second capacitor.

According to one embodiment of the present invention, a capacitance value of the first capacitor is greater than a capacitance value of the second capacitor.

According to one embodiment of the present invention, the passivation layer has a thickness ranging from 1500 Å to 2500 Å.

According to a second aspect of the present invention, a display panel is provided, comprising:
a substrate;
a thin-film transistors (TFT) device layer disposed on the substrate;
a passivation layer disposed on the TFT device layer; and
a conductive film layer disposed on the passivation layer;
wherein the conductive film layer is electrically connected to a gate electrode of a TFT in the TFT device layer through a first via hole, and the conductive film layer at least partially overlaps a source/drain electrode of the TFT to form a first capacitor.

According to one embodiment of the present invention, the first via hole is defined at one side of the source electrode of the TFT and extended through the TFT device layer and the passivation layer.

According to one embodiment of the present invention, the conductive film layer entirely covers the passivation layer.

According to one embodiment of the present invention, the conductive film layer is disposed on the passivation layer and covers a portion of the source electrode of the TFT.

According to one embodiment of the present invention, the display panel further comprises a second capacitor, and the second capacitor is formed in an overlapping region of the source/drain electrode of the TFT and the gate electrode of the TFT.

According to one embodiment of the present invention, the first capacitor is connected in parallel with the second capacitor.

According to one embodiment of the present invention, a capacitance value of the first capacitor is greater than a capacitance value of the second capacitor.

According to one embodiment of the present invention, the conductive film layer is a pixel electrode film layer.

According to one embodiment of the present invention, the passivation layer has a thickness ranging from 1500 Å to 2500 Å.

According to a third aspect of the present invention, a display device is provided, comprising:
a substrate;
a thin-film transistors (TFT) device layer disposed on the substrate;
a passivation layer disposed on the TFT device layer; and
a conductive film layer disposed on the passivation layer;
wherein the conductive film layer is electrically connected to a gate electrode of a TFT in the TFT device layer through a first via hole, and the conductive film layer at least partially overlaps a source/drain electrode of the TFT to form a first capacitor.

According to one embodiment of the present invention, the first via hole is defined at one side of the source of the TFT and extended through the TFT device layer and the passivation layer.

According to one embodiment of the present invention, the conductive film layer entirely covers the passivation layer.

According to one embodiment of the present invention, the conductive film layer is disposed on the passivation layer and partially covers a portion of the source electrode of the TFT.

Advantages of the present invention:

In summary, the advantages of the present disclosure are: The present invention provides a new thin TFT and a GOA driving circuit. By providing a passivation layer and an indium tin oxide film layer in the TFT, the added passivation layer and the indium tin oxide film layer and other film layers constitute a new capacitor, thereby increasing a capacitance value of the GOA circuit, so that a width of a GOA region is reduced, a space occupied by the GOA region is reduced, and the design of narrow-bezel products can be realized.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work or paying the premise.

DETAILED DESCRIPTION OF EMBODIMENTS

The following description is provided with reference to the accompanying drawings to illustrate specific embodiments of the present invention.

Figure 1:
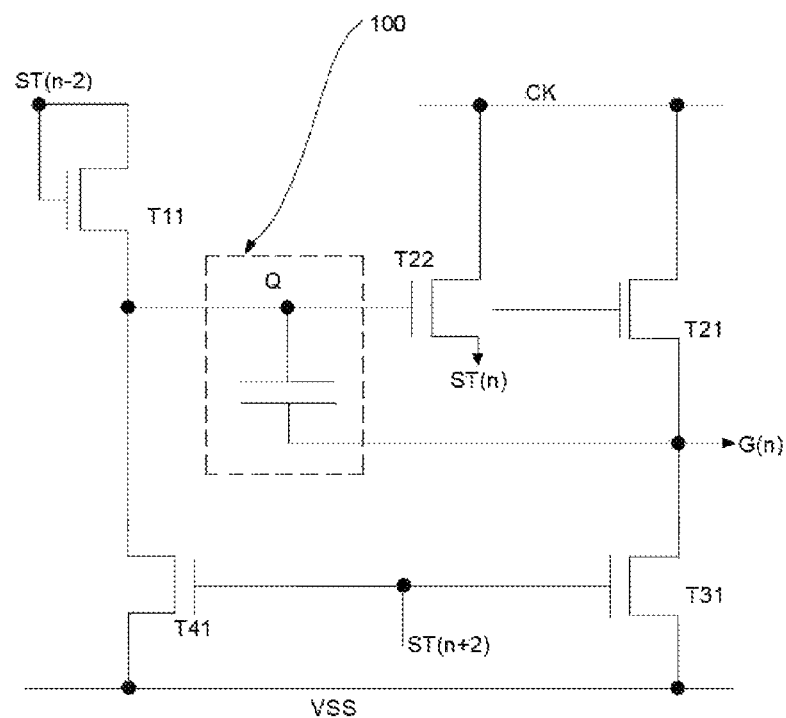
FIG. 1 is an equivalent circuit diagram of a first-level gate-driver-on-array (GOA) circuit of a display panel according to conventional techniques.

As shown in FIG. 1, FIG. 1 is an equivalent circuit diagram of a first-level gate-driver-on-array (GOA) circuit of a display panel according to conventional techniques. A first thin film transistor (TFT) T21 in a second column of a clock signal line is the most important device in the output of the GOA circuit. According to the connection relationship of the TFT T21 in the drawing, a source electrode of the TFT T21 is connected to the clock signal line, and a drain electrode of the TFT T21 is connected to a gate scan line G(n). At the same time, in order to improve the output capability of the GOA circuit, a capacitor is added between the gate electrode and the source electrode of the TFT T21, that is, a boost capacitor 100 in the drawing. As a result, when the circuit is in operation, the boost capacitor 100 increases a potential on the gate electrode of the TFT T21 due to coupling, so that the output capability of the GOA circuit is improved.

Figure 2:
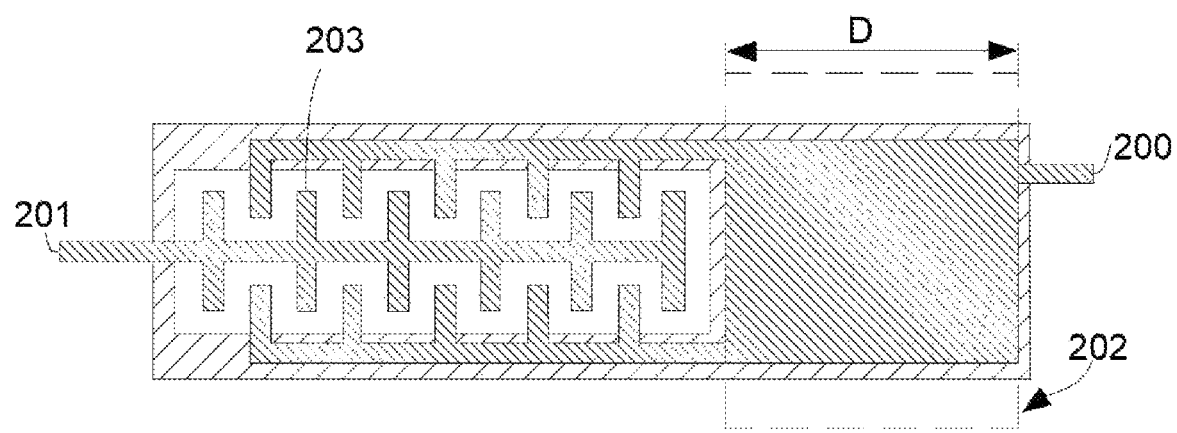
FIG. 2 is a partial planar view of the GOA circuit of FIG. 1.

As shown in FIG. 2, FIG. 2 is a partial planar view of the GOA circuit of FIG. 1. A first clock signal line (CK1) 201, a gate scan line 200, and a TFT T21 203 in a TFT region are included. The first clock signal line 201 is connected to a drain electrode of the TFT. A GOA region 202 is also included in FIG. 2. In general, a capacitance value Cboost of the boost capacitor 100 in the GOA circuit is relatively large. In order to satisfy the capacitance value of the boost capacitor 100, a width D of the GOA region 202 is often designed to be wide. However, the wider the width D is, the larger a space is occupied, which is very unfavorable for designing narrow-bezel products. Therefore, it is necessary to increase the capacitance value of the boost capacitor 100 as much as possible. The higher the capacitance value of the boost capacitor 100 is, the narrower the width D is in the GOA region. When width D is narrow, a bezel of a display panel is narrow. Therefore, a narrow-bezel design for the display panel is realized.

The present disclosure provides a TFT that improves the capacitance value of the boost capacitor 100 by changing the structure inside the display panel without changing the structure of the conventional GOA circuit, so that the width of the GOA region can be reduced.

Figure 3:
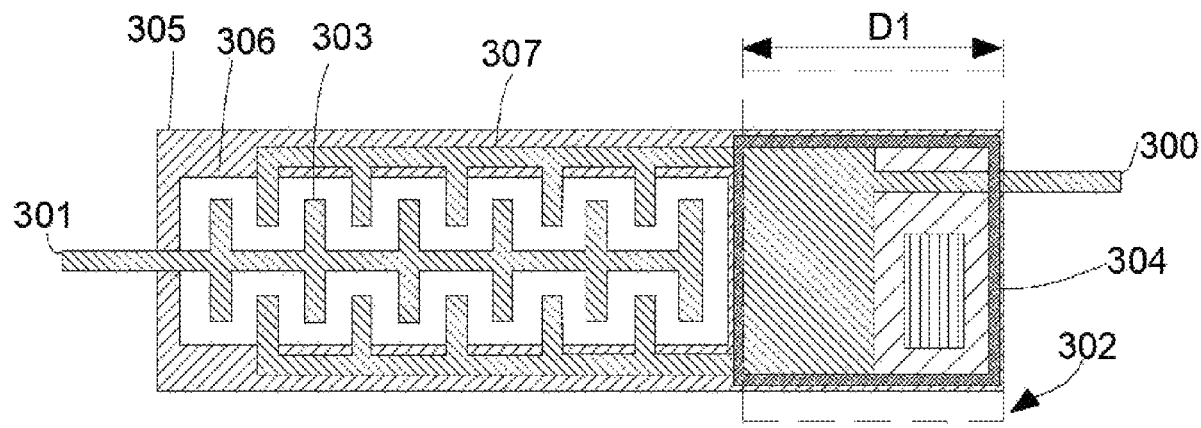
FIG. 3 is a partial planar view illustrating a GOA circuit according to one embodiment of the present invention.

As shown in FIG. 3, FIG. 3 is a partial planar view illustrating a GOA circuit according to one embodiment of the present invention. The GOA circuit comprises a first clock signal line (CK1) 301, a gate scan line 300, and a TFT T21 303. The GOA circuit further includes a GOA region 302 and a conductive film layer 304 in the GOA region 302. The conductive film layer 304 can be a pixel electrode film layer, and the pixel electrode film layer is an indium-tin-oxide film. The GOA circuit also comprises a gate electrode layer 305 of the TFT T21 303, a polysilicon layer 306, and a source electrode 307 disposed on the polysilicon layer 306. In the present embodiment, the conductive film layer 304 is provided in the GOA region 302 to increase the capacitance value Cboost of the boost capacitor 100 in FIG. 1.

Figure 4:
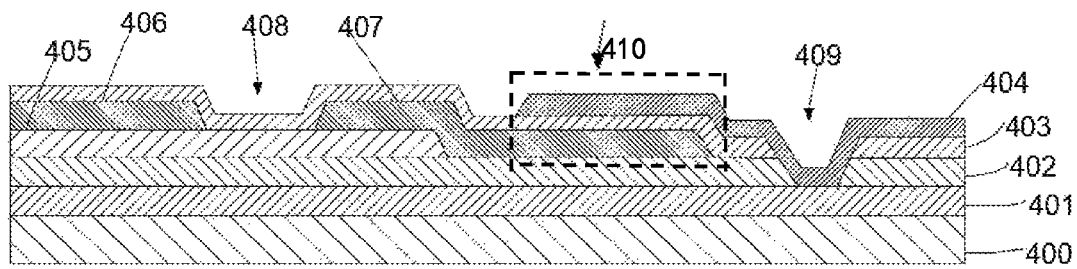
FIG. 4 is a cross-sectional view illustrating a display panel of FIG. 3 according to one embodiment of the present invention.

As shown in FIG. 4, FIG. 4 is a schematic cross-sectional structural view of a display panel according to one embodiment of the present invention. A structure of the display panel comprises: a substrate 400, a gate electrode 401 disposed on the substrate 400, a gate insulating layer 402 disposed on the gate electrode 401, a polysilicon layer 405 disposed on the gate insulating layer 402, a drain electrode 406 and a source electrode 407 of the TFT, and a channel 408 defined between the drain electrode 406 and the source electrode 407. The source electrode 407 and the drain electrode 406 are made of the same material. The gate electrode 401 and the source/drain electrode of the TFT, the gate insulating layer 402, and the polysilicon layer 405 together constitute a TFT device layer.

The display panel further comprises a passivation layer 403 and a conductive film layer 404. The passivation layer 403 is disposed on the gate insulating layer 402. The passivation layer 403 entirely covers the polysilicon layer 405, the source electrode 407, and the drain electrode 406. In the present embodiment, the conductive film layer 404 is disposed on one side of the passivation layer 403 and covers only a portion of the passivation layer 403, and the passivation layer 403 is not completely covered. The passivation layer 403 is made of an insulating material.

In the present embodiment, the gate insulating layer 402 is further provided with a first via hole 409. The first via hole 409 is disposed at one side of the drain electrode 406 of the TFT, and the first via hole 409 is extended through the TFT device layer and the passivation layer 403. The conductive film layer 404 is connected to the gate electrode 401 of the TFT through the first via hole 409, and the conductive film layer 404 comprises an indium tin oxide film layer.

During manufacturing, the first via hole 409 is formed by a photolithography process such as coating, exposure, development, and etching. The gate insulating layer 402 is disposed on the gate electrode 401 by a deposition process, and the gate insulating layer 402 can be a SiOx film, a SiNx film, or a stacked film structure.

The conductive film layer 404 and the source electrode 407 are both conductive layers, so they are equivalent to upper and lower electrode plates of a capacitor. Furthermore, the passivation layer 403 is an insulating medium, so a first capacitor C1 is formed in an overlapping region 410 of the conductive film layer 404 and the source electrode 407. Similarly, a second capacitor C2 is formed in an overlapping region of the gate electrode 401, the source electrode 407, and the gate electrode 401 of the TFT. The first capacitor C1 and the second capacitor C2 are connected in parallel. In the case, in combination with the circuit diagram in FIG. 1, the boost capacitor 100 in the circuit is the first capacitor C1 and the second capacitor C2. The capacitance value of the boost capacitor 100 also becomes the sum of the capacitance values of the two capacitors (C1 and C2). Thereby, the capacitance value in the entire display panel becomes large. Since the capacitance value is large, the width D at the bezel can be reduced in a layout design.

The passivation layer 403 is thin, the passivation layer 403 has a thickness ranging from 1500 Å to 2500 Å, and the thickness is preferably 2000 Å. The gate insulating layer 402 is thick, the gate insulating layer 402 has a thickness ranging from 3500 Å and 4050 Å, and the thickness is preferably 4000 Å. In other words, the capacitance value of the first capacitor is greater than the capacitance value of the second capacitor.

Moreover, the capacitance value depends on an area of the overlapping region 410 of the conductive film layer 404 and the source electrode 407. The larger the overlapping region 410 is, the higher the boost capacitance value is.

The capacitance value in the present invention is higher than the capacitance value in a conventional display panel. Compared with a conventional design, the embodiment based on the planar view of the GOA circuit of FIG. 3 allows the upper and lower electrodes of the boost capacitor to have smaller areas. As a result, the width in the GOA region 302 can be reduced, so the width D1 is decreased to thereby achieve a narrow-bezel product design.

Figure 5:
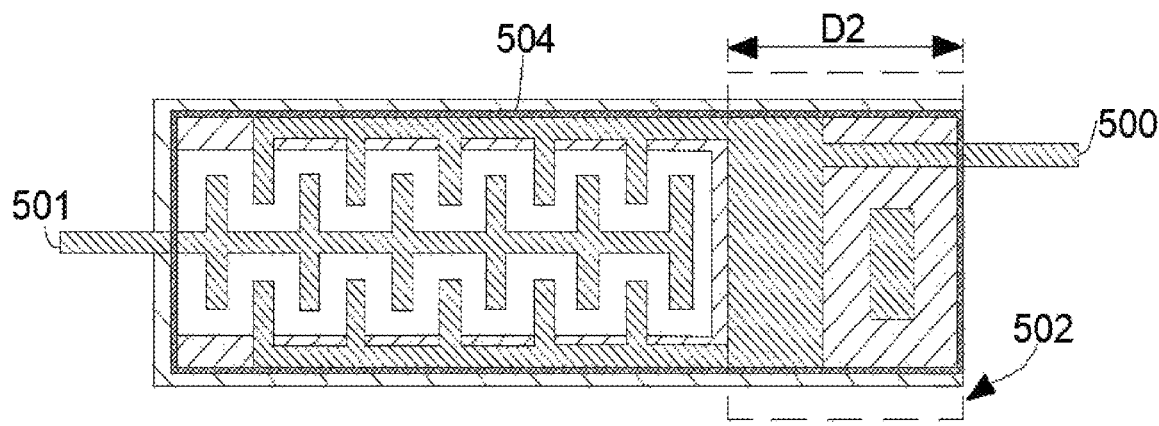
FIG. 5 is a partial planar view illustrating the GOA circuit according to another embodiment of the present invention.

As shown in FIG. 5, FIG. 5 is a partial planar view illustrating the GOA circuit according to another embodiment of the present invention. In the present embodiment, as shown in FIG. 5, a first clock signal line (CK1) 501 is connected to a source electrode of a TFT, and a gate scan line 500 is connected to a drain electrode of the TFT to ensure normal input and output of signals of the TFT. A pixel electrode 504 covers a layout space for the entire GOA circuit.

Figure 6:
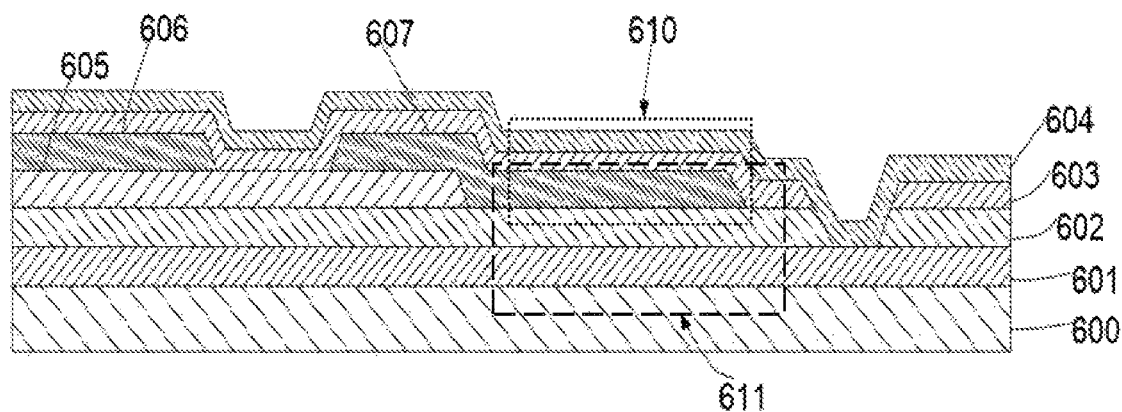
FIG. 6 is a schematic cross-sectional view illustrating the display panel according to another embodiment of the present invention.

As shown in FIG. 6, FIG. 6 is a schematic cross-sectional view of a display panel of another embodiment of the present disclosure. The pixel electrode 604 completely covers the entire passivation layer 603. Other film layer structure of the display panel is the same as the structure of FIG. 4. A substrate 600, a gate electrode 601, a gate insulating layer 602, and a polysilicon layer 605, a source electrode 607, and a drain electrode 606 are sequentially disposed from bottom to top, and the specific structure is not described in detail herein. According to the principle of forming the boost capacitor in FIG. 4, it can be known that in the present embodiment, a first overlapping region 610 and a second overlapping region 611 are formed in the display panel. The first overlapping region 610 is an overlapping region of the pixel electrode 604 and the source electrode 607 of the TFT, and the first overlapping region 610 constitutes a first capacitor C1, wherein the upper and lower conductive layers are respectively upper and lower electrode plates of the first capacitor C1. Similarly, the second overlapping region 611 of the source electrode 607 and the gate electrode 601 of the TFT constitutes a second capacitor C2 of the display panel. The first overlapping region 610 and the second overlapping region 611 in the drawing only illustrate a part of the entire display panel, and any overlapping portions of the corresponding film layers in other regions are the first capacitor C1 and the second capacitor C2 of the present embodiment.

In the structure and the connection relationship, the first capacitor C1 and the second capacitor C2 in the embodiment are connected in parallel. Therefore, a total capacitance value in the display panel is C=C1+C2. Furthermore, by adding a conductive film layer, the entire capacitance value in the display panel increases. Specifically, in the planar layout of FIG. 5, an area of the pixel electrode 604 is larger, and therefore, when the first capacitor is constituted by the pixel electrode 604 and the gate electrode 601 and the passivation layer 603, an overlapping area between them is larger, and as a result, the capacitance value of the first capacitor is larger.

Therefore, the width D2 at the side is further reduced. Although the width D2 is small, the capacitance value of the display panel can still be satisfied. In the case of the layout of the GOA circuit in FIG. 5, the GOA region can be further reduced, and the width D2 is narrower, which is more advantageous for the design of narrow-bezel products. According to the above different embodiments, the width relationship of the GOA region is D>D1>D2, that is, the more the passivation layer is covered by the conductive film layer, the narrower the width D is at the edge.

Figure 7:
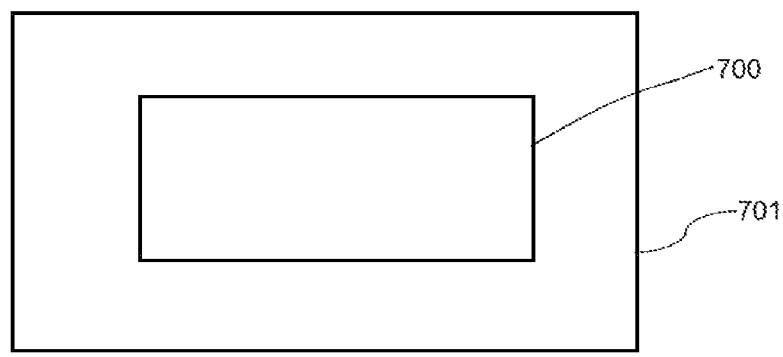
FIG. 7 is a schematic view illustrating a display device according to one embodiment of the present invention.

The present invention further provides a display device. The display device comprises the display panel of the above embodiment of the present invention. As shown in FIG. 7, FIG. 7 is a schematic view illustrating a display device according to one embodiment of the present invention. In the display device 700 according to the present embodiment, the display device 700 comprises a display panel 701 of the above embodiment. A capacitance value of a boost capacitor of a driving circuit in the display panel 701 is higher than a capacitance value of a boost capacitor in conventional designs. Therefore, in a layout of a GOA circuit, a space occupied by a GOA region is smaller.

The display panel and the display device provided by the present invention are described in detail above. The description of the above embodiments is only for ease of understanding the technical solutions and the main ideas of the present invention. Those of ordinary skill in the art are able to modify or change the technical solutions described in the foregoing embodiments based on the technical solutions of the embodiments described above. All such modifications and changes are deemed to be within the protection scope of the present invention.

What is claimed is:

1. A display panel, comprising:
a substrate;
a thin-film transistors (TFT) device layer disposed on the substrate;
a passivation layer disposed on the TFT device layer;
a conductive film layer disposed on the passivation layer; and
a second capacitor;
wherein the conductive film layer is electrically connected to a gate electrode of a TFT in the TFT device layer through a first via hole, and the conductive film layer overlaps a source/drain electrode of the TFT to form a first capacitor;
wherein the first via hole is defined at one side of the source/drain electrode of the TFT and extends through the TFT device layer and the passivation layer, and the conductive film layer comprises a pixel electrode film layer;
wherein the conductive film layer entirely covers the passivation layer, and the conductive film layer entirely covers the source/drain electrode of the TFT;
wherein the second capacitor is formed in an overlapping region of the source/drain electrode of the TFT and the gate electrode of the TFT, the first capacitor is connected in parallel with the second capacitor, and a capacitance value of the first capacitor is greater than a capacitance value of the second capacitor.

2. The display panel according to claim 1, wherein the passivation layer has a thickness ranging from 1500 Å to 2500 Å.

* * * * *